(12) United States Patent
Schwieters

(10) Patent No.: US 6,452,165 B1
(45) Date of Patent: Sep. 17, 2002

(54) FARADAY COLLECTOR FOR MEASURING ION CURRENTS IN MASS SPECTROMETERS

(75) Inventor: Johannes Schwieters, Ganderkesee (DE)

(73) Assignee: Finnigan MAT GmbH (DE)

(*) Notice: Subject to any disclaimer, the term of this patent is extended or adjusted under 35 U.S.C. 154(b) by 0 days.

(21) Appl. No.: 09/376,448

(22) Filed: Aug. 18, 1999

(51) Int. Cl.⁷ .............................................. H01J 37/244
(52) U.S. Cl. ..................... 250/283; 250/299; 250/397
(58) Field of Search .................. 250/283, 299, 250/397

(56) References Cited

U.S. PATENT DOCUMENTS 4,124,801 A 11/1978 Cook et al.
4,524,275 A * 6/1985 Cottrell et al. ............... 250/299
4,608,493 A 8/1986 Hayafuji
5,814,823 A * 9/1998 Benveniste .................. 250/397

FOREIGN PATENT DOCUMENTS

| DE | 195 11 958 A1 | 10/1996 |
| GB | 1397852 | 5/1973 |
| GB | 2045518 | 3/1979 |

* cited by examiner

Primary Examiner—Jack Berman
(74) Attorney, Agent, or Firm—Dorsey & Whitney LLP

(57) ABSTRACT

A Faraday collector for measuring ion currents in mass spectrometers, having a cup (11) for capturing the ions, an entrance slit (14) and a secondary electron diaphragm (13) is configured in a special way. The cup (11) consists of two half-shells (18, 19) of solid graphite and his held in a frame (12) with insulators (30).

13 Claims, 2 Drawing Sheets

FARADAY COLLECTOR FOR MEASURING ION CURRENTS IN MASS SPECTROMETERS

This application claims priority to German application No. 19838553.6, filed Aug. 25, 1998.

The invention relates to a Faraday collector for measuring ion currents in mass spectrometers, having a cup for capturing the ions, an entrance slit and, in particular, a secondary electron diaphragm.

Faraday collectors are used for the precise measurement of ion currents, in particular in the sector field mass spectrometers. Ions produced by an ion source are focused by means of ion optics onto the entrance slit of a mass analyser. The mass analyser consists of at least one magnetic sector field which may be combined with one or more electrostatic sector fields and suitable drift paths. In the simplest version, the mass analyser consists of an entrance slit, a field-free drift path, followed by a magnetic sector field for mass resolution, and a further field-free drift path at the end of which there is a detector having collectors.

The field-free drift paths and the geometry of the magnetic sector fields together form an ion optical system. The dimensions are selected in such a way that ion beams of different mass, which pass through the entrance slit of the spectrometer, are sharply projected onto various positions along the so-called image curve of the mass analyser. In order to measure these mass-resolved ion currents, Faraday collectors are positioned along the image curve. These customarily consist of at least one entrance slit, a secondary electron suppression diaphragm and a collector cup.

Since a plurality of Faraday collectors need to be positioned in parallel along the image curve, there are geometrical constraints on their design dimensions. The maximum width of the collector is limited by the minimum distance between the two adjacent mass-resolved ion currents which need to be measured simultaneously. This distance is typically about 2 to 3 mm, but may also be smaller or larger. The small geometrical size represents a problem for reliable and precise construction of Faraday collectors.

When the ions strike the inside of the collector cup, a wide range of secondary particles is produced, namely secondary electrons, positive secondary ions, negative secondary ions, neutral particles and photons. Further to this, there is also a possibility that, when they "impact" on the collector surface (cup end), the incident particles will be directly reflected and scattered out of the collector cup.

In order for the Faraday collector to measure the charge current of the ions correctly and without distortion, no charged secondary particles and no injected ions should leave the Faraday collector again. If they did, this would vitiate the ion current measurement. This leads to particular requirements in terms of the design and structure of a Faraday collector:

1. the collector cup should be as narrow and deep as possible so that, merely on geometric grounds, the probability of a particle's escaping is low.
2. The collector should be precisely aligned so that the ions enter the collector cup to the greatest possible depth. This is intended to prevent the sides from being hit when still close to the input opening and secondary particles being created which can leave the collector.
3. The collector cup should be ideally tight.
4. The secondary electron diaphragm should be fitted tightly and precisely in front of the collector cup in order to effectively brake the charged negative secondary particles and return them into the collector cup.
5. The collector cup must be electrically screened against external scattered particles.
6. The internal surface of the collector should consist of a material with low secondary particle yields.
7. The collector must be clean, free of dust and everywhere electrically conductive so that the electric charge can be dissipated quantitatively and no local build-up of charges is created.

Particular demands are made of the mechanical design of the collector. Narrow mechanical tolerances of about 0.05 mm need to be met in a small space. Added to this is the problem that some of the individual parts of the Faraday collector need to be electrically insulated against earth potential (for example the inner collector cup and the secondary electron diaphragm). Typically, insulation resistances of better than $10^{13}$ ohms need to be ensured.

The inner collector cups of modern collectors (also referred to as Faraday cups) generally consist of small metal cups which are internally lined in a variety of ways with graphite. Graphite or carbon surfaces are particularly suitable since this material has good electrical surface properties. For example, the collector cups are painted with a kind of graphite paint or graphite powder, or internally lined with thin graphite cladding. This indirect lining of the inner cup with graphite paint causes problems with reproducibility of the surface preparation and durability of the layers. Even after relatively short periods of use, the electrical properties of these layers can change. The lining with thin graphite plates further limits the usable internal width of the collector. The internal graphite plates must be mechanically stable and reproducibly fitted into the collector cup and held. This often represents a particular technical problem.

OBJECT AND SUMMARY OF INVENTION

The object of the present invention is to provide a Faraday collector having improved mechanical properties. The Faraday collector according to the invention is characterized in that the cup has solid graphite walls. Whereas conventional collectors have sheet metal walls lined with graphite, the collector according to the invention has solid graphite walls.

The collector cup is advantageously entirely made of graphite and therefore only has walls of solid graphite.

It is advantageously made of two graphite half-shells connected to one another. They contain a cavity between them which is open on one side for the ions to enter.

The half-shells are held together by clamps which at the same time serve as spacers against an outer frame.

The material of the cup is high-purity solid graphite. The two half-shells have extremely good geometrical stability, fit into one another exactly using a precision groove and form a light-tight labyrinth-like connection. High mechanical stability, high reproducibility of surface properties and optimum use of the limited collector width dictated by the ion optics are achieved. It is not necessary for any additional layers, which would unnecessarily reduce the effective internal width of the collector, to be applied indirectly to the collector. The half-shells are machined from a uniform block of material and therefore have an electrically uniform surface, which is reproducible. Adhesion problems of indirectly applied layers and mechanical problems of holding thin cladding are eliminated.

Other features of the invention can moreover be found in the description and the claims. Illustrative embodiments of the invention will be explained in more detail below with reference to the figures, in which:

DETAILED DESCRIPTION OF PREFERRED EMBODIMENT

Figure 1:
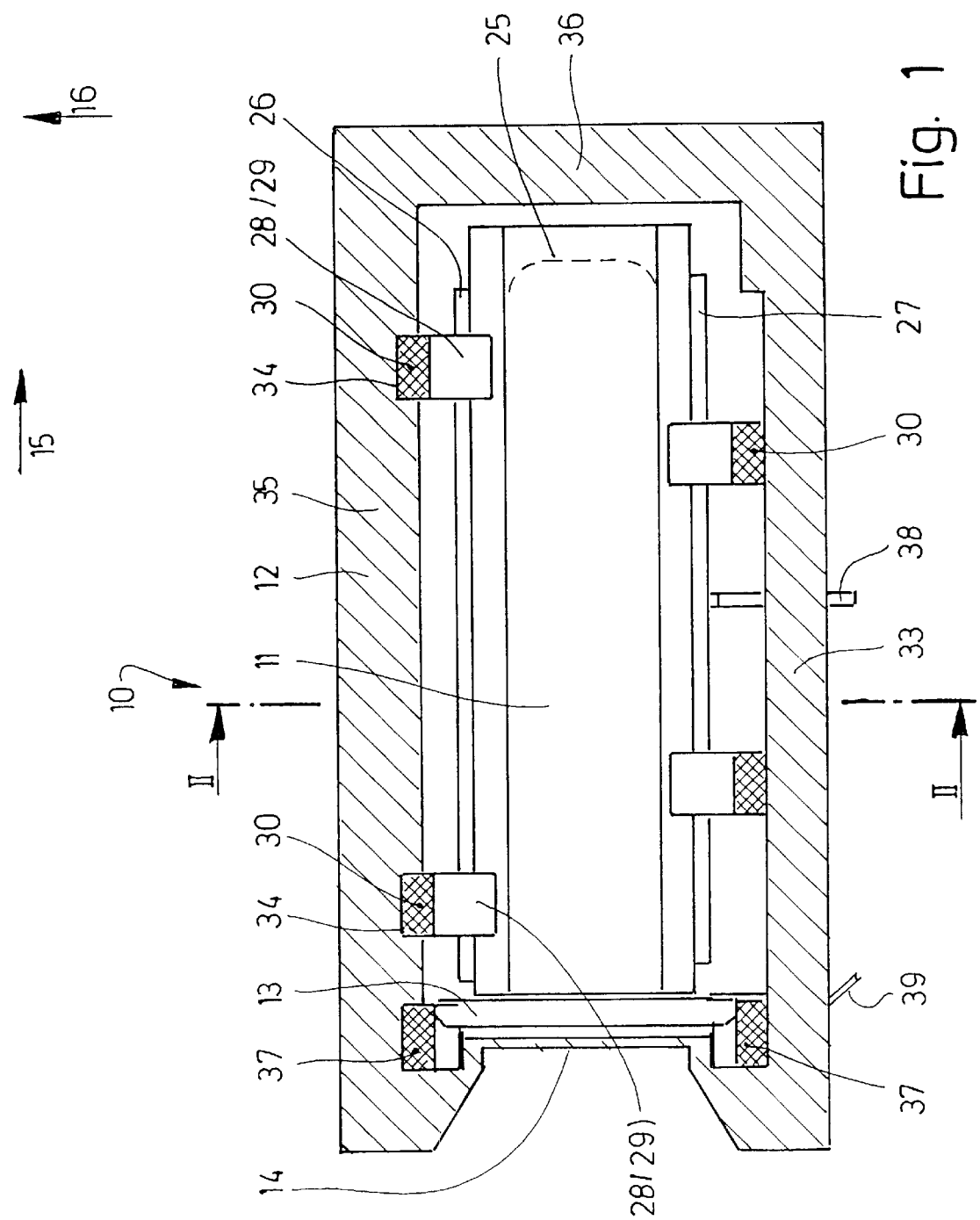
FIG. 1 shows a side view of a Faraday collector according to the invention.
Figure 2:
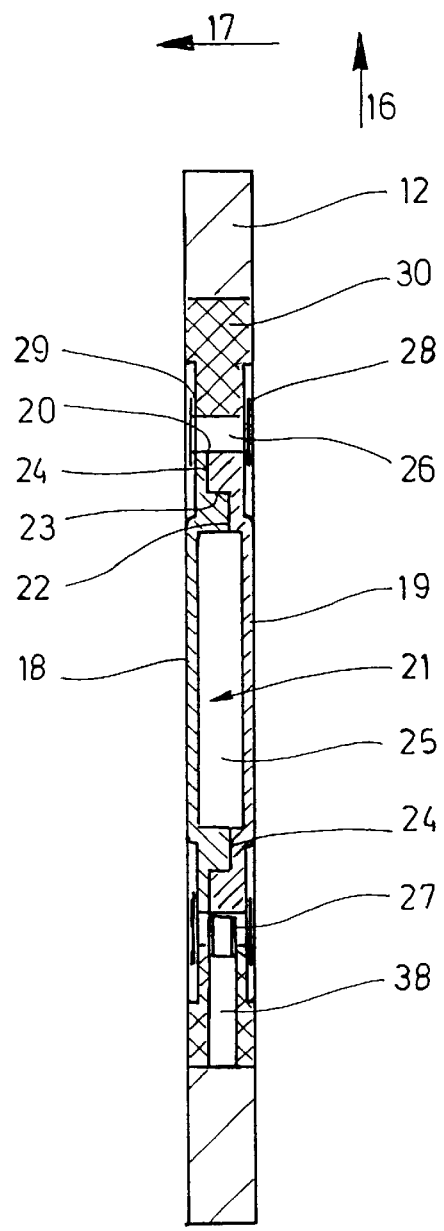
FIG. 2 shows a cross section through the Faraday collector according to FIG. 1 on the line II—II.
Figure 3:
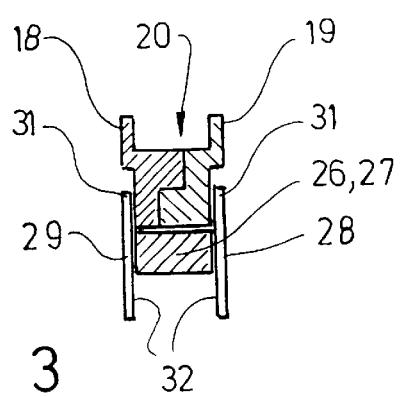
FIG. 3 shows a detail of the cross section according to FIG. 2.

A Faraday collector 10 according to the invention has a cup 11—or inner cup—and an outer frame 12—or cup frame. There is also a secondary electron diaphragm 13 as well as an entrance slit 14. The cup 11 is held in the frame 12 using special retaining components.

The Faraday collector is of substantial length (arrow 15), small height (arrow 16) and very small width (arrow 17).

The cup 11 essentially consists of two half-shells 18, 19 made of solid high-purity graphite which are connected to one another. A connecting groove 20 between the half-shells 18, 19 extends around the cup 11—with the exception of an opening region near the entrance slit 14—and does so parallel to a plane formed by arrows 15 (length) and 16 (height). The connecting groove 20 is designed as a labyrinth, viewed outwards from the internal space 21 of the cup 11, with an outwardly directed section 22, a section 23 following this in the transverse direction and a direction 24 following this and once more directed outwards, the term "outwards" meaning parallel to the height (16) or length (15).

In the region of the groove 20 the two half-shells 18, 19 are pressed together firmly by the aforementioned retaining component. A cup end 25 lying opposite the entrance slit 14 is likewise divided by the groove 20.

Parallel to the longitudinal direction of the collector (arrow 15), the connecting groove 20 is respectively covered at the outer top and at the outer bottom by a metal rail 26, 27. Each rail 26, 27 extends virtually over the entire length of the two half-shells 18, 19.

The aforementioned retaining components consist, in the present case, of the metal rails 26, 27, metal clamping sheets 28, 29 and insulators 30, each pair of metal clamping sheets being attached opposite one another to the metal rail 26, with projections 31, 32 above and below the metal rail. Two pairs of metal clamping sheets 28, 29 are attached to each metal rail 26, 27. Each pair of metal clamping sheets form a clamp and hold together the two half-shells 18, 19 between the inner projections 31. On the opposite side, an insulator 30, in the present case a ceramic block, is in each case held between the projections 32.

When assembling the Faraday collector 10, the half-shells 18, 19 are brought together and connected to one another by the retaining components described above. The cup 11 is then put in the frame 12 transversely with respect to the longitudinal direction 15. The insulators 30 then bear on a lower longitudinal span 33 of the frame 12. The upper insulators enter accurately fitting prefabricated recesses 34 in an upper longitudinal span 25. The recesses 34 have a depth of about one third of the height of the insulators 30, so that the metal clamping sheets 28 do not enter into contact with the frame 12 under any circumstances. Near to the cup end 25 the two longitudinal spans 33, 35 are connected to one another by an upright end span 36. In FIG. 1 the frame 12 is indicated by hatching. In fact, the view is a plan view. The hatching is only provided for better visual definition. The frame 12 is overall rectangular, the metal entrance slit (not shown) 14 being arranged opposite the end span 36.

The cup end 25 does not extend exactly in a transverse plane with respect to the longitudinal direction 15, but is instead wedged and therefore somewhat obliquely directed (not shown). By virtue of this, ions entering the cup 11 in the longitudinal direction are not reflected in the direction of the entrance slit 14. Instead, they are deflected in the direction of one of the two large side walls or half-shells 18, 19.

The half-shells 18, 19 are incorporated in the about 3 mm wide frame 12 of sheet metal in such a way that there is a continuous gap between the cup 11 and the frame 12. The secondary electron (SE) diaphragm 13 is arranged on the input side, that is to say between the entrance slit 14 and the half-shells 18, 19. This is at a small distance of about 0.2 mm from the cup 11 and is held in the frame 12 on insulators 37 and, where appropriate, clamps.

The cup 11 and the diaphragm 13 are provided with leads which are fed through corresponding bores in the frame 12, in the present case in the lower longitudinal span 33. About in the middle, a signal line 38 connected to the cup 11 emerges from the longitudinal span 33. There is an SE line 39 assigned to the diaphragm 13.

The collector 10 which has been described is, lastly, encased in metal foil (not shown) or covered with it.

In order for the foil not to come into contact with the half-shells 18, 19, the walls of the foil are preformed with a slight curvature.

What is claimed is:

1. Faraday collector for measuring ion currents in mass spectrometers, having a cup (11) for capturing the ions, an entrance slit (14) and a secondary electron diaphragm (13), characterized in that the cup (11) has a parallelpipedal configuration with a large extent in the longitudinal direction (arrow 15)—which is also the main ion input direction—a small extent in the height direction (arrow 16) and an even smaller width (arrow 17); and the cup is formed by two solid graphite walls which are connected to one another and contain between them an internal space (21) which is open on at least one end, said walls being formed by two graphite half-shells (18–19), said half shells being divided parallel to the longitudinal direction (arrow 15).

2. Device according to claim 1 characterized in that, in the region of the transition between two walls (18, 19), a labyrinth-like separating groove (20) is formed by corresponding geometrical shaping.

3. Device according to claim 1 characterized in that the inner faces of the cup are angled off in relation to the parallelpipedal shape, and in that in particular a cup end (25) remote from the entrance slit (14) is configured in such a way that directly incident ions are reflected in the direction of other walls and not in the direction of the entrance slit (14).

4. Device according to claim 1 characterized in that the walls (18, 19) are held together by clamps.

5. Device according to claim 4, characterized in that clamps are arranged on the longitudinal narrow sides of the cup (11).

6. Device according to claim 4, characterized in that the clamps have clamp limbs made of resilient sheet metal.

7. Device according to claim 6, characterized in that the clamps have two mutually opposite clamp limbs (28, 29) which are separated by a spacer element and are each connected to the spacer element, an intermediate space being formed outside the spacer element between the clamp limbs to receive parts of the walls (18, 19) of the cup (11).

8. Device according to claim 7, characterized in that the spacer element is a metal rail (26, 27) which extends in the longitudinal direction of the cup (11) and bears on the latter, in particular covering the separating groove (20).

9. Device according to claim 7, characterized in that, outside the spacer element and opposite the cup (11), the clamps (28, 29) hold an insulator (30) between the clamp limbs.

10. Device according to claim 9, characterized in that the insulator is a ceramic block, each clamp being assigned one ceramic block.

11. Device according to claim 1, characterized in that the cup (11) is held in a surrounding outer frame (12) and is insulated from the frame.

12. Device according to claim 11, characterized in that insulators (30) bear internally on the outer frame (12).

13. Device according to claim 11, characterized in that the outer frame (12) consists of sheet metal, the thickness being measured in the direction of the width (arrow 17).

* * * * *